(12) United States Patent
Tourino et al.

(10) Patent No.: US 9,728,663 B1
(45) Date of Patent: Aug. 8, 2017

(54) SOLAR CELL ASSEMBLY AND METHOD OF BONDING A SOLAR CELL COMPONENT TO A FLEXIBLE SUPPORT

(71) Applicant: SolAero Technologies Corp., Albuquerque, NM (US)

(72) Inventors: Cory Tourino, Edgewood, NM (US); Benjamin C. Richards, Albuquerque, NM (US)

(73) Assignee: SolAero Technologies Corp., Albuquerque, NM (US)

( * ) Notice: Subject to any disclaimer, the term of this patent is extended or adjusted under 35 U.S.C. 154(b) by 292 days.

(21) Appl. No.: 14/282,610

(22) Filed: May 20, 2014

(51) Int. Cl.
| | |
|---|---|
| H01L 51/52 | (2006.01) |
| H01L 51/56 | (2006.01) |
| H01L 31/042 | (2014.01) |
| F24J 2/46 | (2006.01) |
| F24J 2/00 | (2014.01) |
| H01L 31/054 | (2014.01) |
| H01L 31/0216 | (2014.01) |

(52) U.S. Cl.
CPC ......... H01L 31/0422 (2013.01); *F24J 2/0015* (2013.01); *F24J 2002/4676* (2013.01); *H01L 31/0216* (2013.01); *H01L 31/0549* (2014.12); *H01L 51/5275* (2013.01); *H01L 51/56* (2013.01); *Y02E 10/50* (2013.01); *Y02E 10/52* (2013.01); *Y10T 156/1002* (2015.01); *Y10T 156/1028* (2015.01); *Y10T 156/1043* (2015.01); *Y10T 156/1044* (2015.01); *Y10T 156/1052* (2015.01); *Y10T 156/1062* (2015.01); *Y10T 156/1082* (2015.01); *Y10T 156/12* (2015.01); *Y10T 156/17* (2015.01); *Y10T 156/1798* (2015.01)

(58) Field of Classification Search
None
See application file for complete search history.

(56) References Cited

U.S. PATENT DOCUMENTS

| 8,107,777 B2 | 1/2012 | Farah | |
|---|---|---|---|
| 9,379,274 B1* | 6/2016 | Richards | H01L 31/048 |
| 2008/0314436 A1* | 12/2008 | O'Connell | H01L 31/02167 |
| | | | 136/246 |
| 2012/0090661 A1 | 4/2012 | Capps et al. | |
| 2014/0077201 A1* | 3/2014 | Becker | H01L 51/107 |
| | | | 257/40 |

FOREIGN PATENT DOCUMENTS

WO    WO 2006/108314 A1    10/2006

* cited by examiner

*Primary Examiner* — Linda L Gray (57) ABSTRACT

A solar cell assembly and a method of bonding a solar cell component to a flexible support are disclosed. The solar cell assembly comprises a flexible support with a predetermined size, a solar cell component, bonding adhesive between the support and the solar cell component, wherein the support with the predetermined size has substantially uniform borders of 0.003 inches to 0.2 inches in width extending beyond the edges of the solar cell component.

20 Claims, 6 Drawing Sheets

SOLAR CELL ASSEMBLY AND METHOD OF BONDING A SOLAR CELL COMPONENT TO A FLEXIBLE SUPPORT

BACKGROUND OF THE INVENTION

Field of the Invention

The present disclosure relates to a solar cell assembly and a method of bonding a solar cell component to a flexible support in order to manufacture the solar cell assembly.

Description of the Related Art

A solar cell assembly can be manufactured by bonding a solar cell component to a support. In the solar cell assembly, bonding adhesive is disposed between the solar cell component and the support, in order to bond the solar cell component to the support. In the prior art, U.S. Patent Application Publication No. 2012/0090661 A1 (Capps et al.) discloses individually encapsulated solar cells and solar cell strings. U.S. Pat. No. 8,107,777 B2 (Farah) discloses a polyimide support bonded on other support. International Application Publication No. WO 2006/108314 A1 (Buechel) discloses a solar cell module and a method of encapsulating the solar cell module.

Figure 1A:
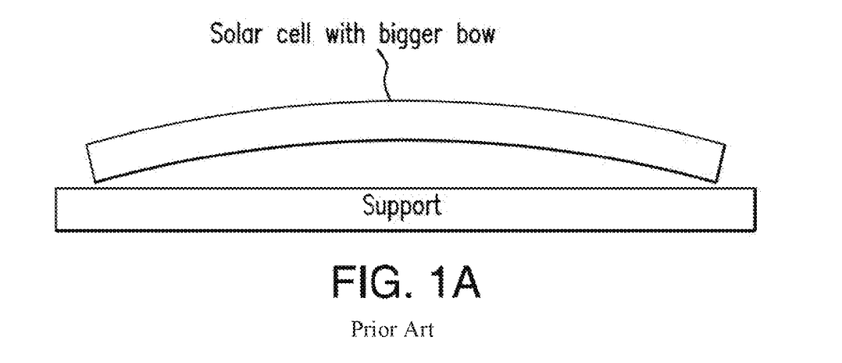
FIG. 1A is a simplified view schematically illustrating a case of solar cell having a relatively bigger bow.
Figure 1B:
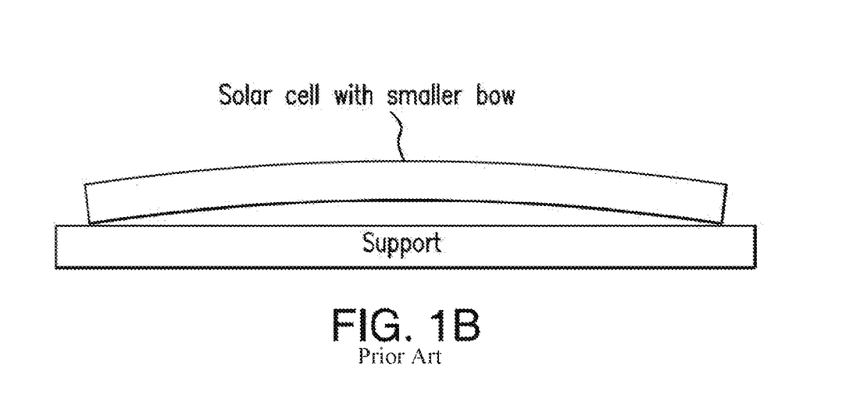
FIG. 1B is a simplified view schematically illustrating a case of solar cell having a relatively smaller bow.

A bowing phenomenon often occurs in solar cells, especially in large area solar cells. The bowing phenomenon in solar cells means that the top surfaces and the bottom surfaces of the solar cells are not ideally flat. Further, the degrees of the bowing phenomenon may differ among solar cells. In other words, some solar cells may have relatively bigger bow as illustrated in FIG. 1A, while some other solar cells may have relatively smaller bow as illustrated in FIG. 1B. It should be understood that FIGS. 1A and 1B are illustrative and do not denote the real size of the solar cells and the real degrees of bowing. The real degrees of bowing of the solar cells are much lower than those as illustrated by FIGS. 1A and 1B.

The bowing phenomenon can cause the following problem. Specifically, a relatively bigger bow renders a relatively bigger space between a solar cell and a support, and a relatively smaller bow renders a relatively smaller space between a solar cell and a support. When bonding adhesive is disposed between the solar cell and the support in order to bond them together, a relatively larger amount of bonding adhesive can reside in the relatively bigger space between the solar cell with a relatively bigger bow and the support as illustrated in FIG. 1A. However, when bonding adhesive is disposed between the solar cell and the support in order to bond them together, a relatively smaller amount of bonding adhesive can reside in the relatively smaller space between the solar cell with a relatively smaller bow and the support as illustrate in FIG. 1B. In this case, excessive amount of bonding adhesive may flows to the edges. The excess bonding adhesive can flow to the edges, and disadvantageously may further flow away from the edges and contaminate the solar cell and the support.

Thus, a method of bonding a solar cell to a support, in which the bonding adhesive is prevented from flowing away from the edges, is needed in the art.

SUMMARY

According to an aspect of an embodiment of the present disclosure, there is provided a method of bonding a solar cell component to a support, the method comprising: providing a solar cell component having a top side and a bottom side; providing a flexible support having a top side and a bottom side; cutting the support to a predetermined size; dispensing bonding adhesive on the top side of the support or on bottom side of the solar cell component; and contacting the bottom side of the solar cell component with the top side of the support, wherein the support has substantially uniform borders of 0.003 inches to 0.2 inches in width extending beyond the edges of the solar cell component.

According to an implementation, contacting in the method may further comprise weighting the solar cell component in contact with the support.

According to another aspect of an embodiment of the present disclosure, there is provided a solar cell assembly, comprising: a flexible support having a top side and a bottom side and a predetermined size; a solar cell component having a top side and a bottom side; and bonding adhesive located between the top side of the support and the bottom side of the solar cell component, wherein the support has substantially uniform borders of 0.003 inches to 0.2 inches in width extending beyond the edges of the solar cell component.

Further aspects, features and advantages of the present disclosure will be understood from the following description with reference to the drawings.

BRIEF DESCRIPTION OF THE DRAWINGS

The accompanying drawings, which are incorporated in and constitute a part of the specification, illustrate embodiments of the disclosure and, together with the description, serve to explain the principles of the disclosure.

DESCRIPTION OF THE EMBODIMENTS

Embodiments of the present disclosure will be described in detail below with reference to the drawings. Note that similar reference numerals are used to refer to similar elements throughout the drawings, and thus repetitive descriptions thereof are omitted.

Figure 2:
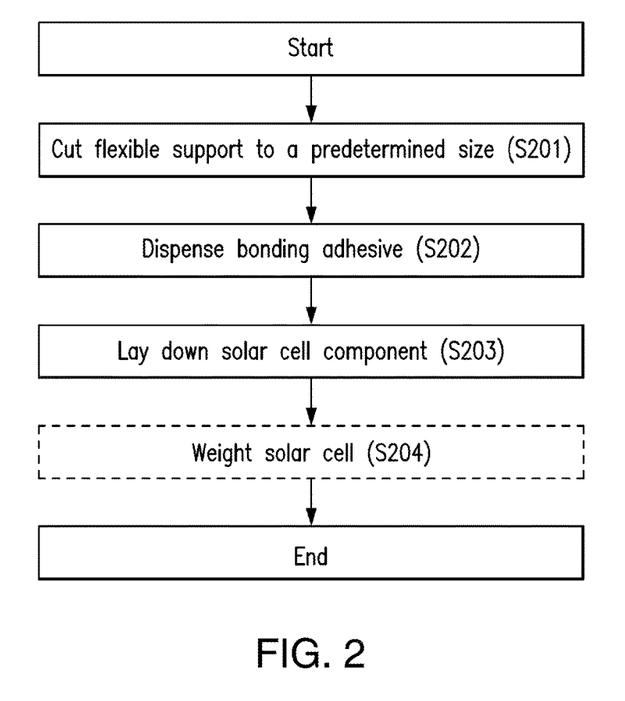
FIG. 2 illustrates certain embodiments of the method of bonding a solar cell component to a flexible support as described herein.

FIG. 1A is a simplified view schematically illustrating a case of solar cell having a relatively bigger bow. FIG. 1B is a simplified view schematically illustrating a case of solar cell having a relatively smaller bow. FIG. 2 schematically illustrates certain embodiments of the method of bonding a solar cell component to a flexible support as described herein.

An insulating flexible support can be prepared in advance. The insulating flexible support can be made of a flexible material. For example, it can be made of a polyester, polyamide, or polyimide material. In some embodiments, the insulating flexible support can be made as a continuous strip or sheet.

A solar cell component can also be prepared in advance. The solar cell component can be in the form of one or more of an individual solar cell, a coverglass-interconnect-cell (CIC) assembly, a string of solar cells, and a string of coverglass-interconnect-cells (CICs). In a string of solar cells or a string of CICs, it may be preferred that the solar cells or CICs are attached and connected together by welding, soldering, wire boding, conductive paste, or the like.

The method of bonding a solar cell component to a flexible support according to this application will be described with reference to FIG. 2.

In step S201, the flexible support is cut to a predetermined size. According to one embodiment, the flexible support is cut, so that support with the predetermined size has substantially uniform borders of 0.003 inches to 0.2 inches in width extending beyond the edges of the solar cell component. The particularly designed substantially uniform borders of 0.003 inches to 0.2 inches in width extending beyond the edges of the solar cell component are advantageous over the prior art. Specifically, the substantially uniform borders are particularly designed, because it has been found that such designed substantially uniform borders can enable the fluid bonding adhesive to wick and stay adjacent the edges of the solar cell by surface tension, as described herein. That is, the particularly designed substantially uniform borders of 0.003 inches to 0.2 inches in width help to prevent the fluid bonding adhesive from flowing away from the edges.

Figure 3:
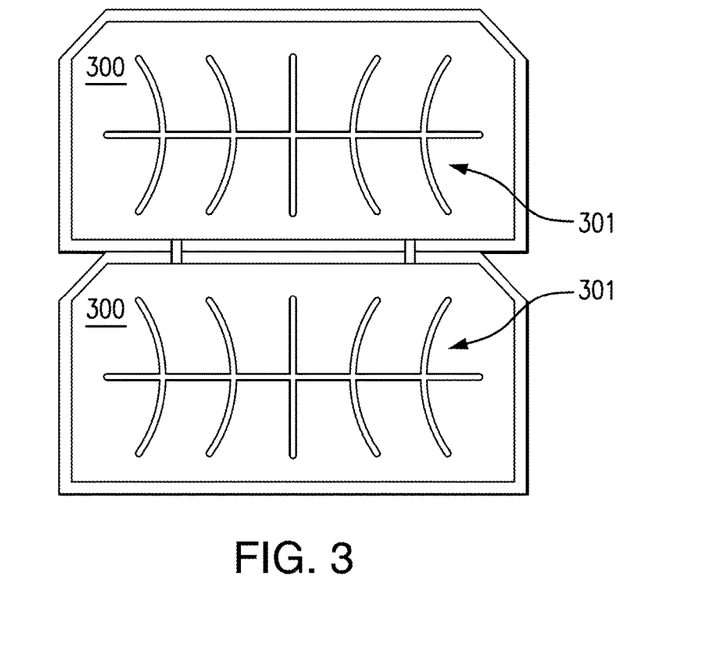
FIG. 3 is a simplified view schematically illustrating a possible pattern of the bonding adhesive dispensed on top of the support or on bottom of the solar cell component.

In step S202, the bonding adhesive can be dispensed. The bonding adhesive can be dispensed on top of the support or on the bottom of the solar cell component. The bonding adhesive can be dispensed in a pattern. For example, the bonding adhesive can be dispensed on the solar cells 300 in a pattern 301 as illustrated in FIG. 3. However, the pattern 301 of the bonding adhesive is not limited, as long as the solar cells can be bonded to the flexible support. Instead of dispensing the bonding adhesive on bottom of the solar cells 300 as illustrated in FIG. 3, the bonding adhesive can also be dispensed on top of a support. In some embodiments, the bonding adhesive has a viscosity of 1000 mPas to 50000 mPas.

In step S203, the solar cell component can be laid down onto the support. The solar cell component can be aligned with the support, in order to leave substantially uniform borders of 0.003 inches to 0.2 inches in width of the support extending beyond the edges of the solar cell component. In some embodiments, the border can have a width of 0.003 inches to 0.1 inches, 0.003 inches to 0.05 inches, 0.005 inches to 0.025 inches, or even 0.010 inches to 0.025 inches.

The solar cell component can be bonded to the flexible support with the bonding adhesive. If a solar cell is bowing, the flexible support can conform to the bow of the solar cell. Accordingly, the bonding adhesive can have a substantially uniform thickness under the solar cell. A part of bonding adhesive can flow to the borders of the flexible support. Because the flexible support can conform to the bow of the solar cell, the space between the solar cell and the support may not vary significantly between the case of a relatively bigger bow and the case of a relatively small bow. Accordingly, the amount of bonding adhesive flow to the border may not vary significantly between the case of a relatively bigger bow and the case of a relatively small bow. Because of the particularly designed substantially uniform borders of 0.003 inches to 0.2 inches in width extending beyond the edges of the solar cell component, the fluid bonding adhesive can wick and stay adjacent the edges of the solar cell by surface tension. Accordingly, the particularly designed substantially uniform borders of 0.003 inches to 0.2 inches in width can help to prevent the fluid bonding adhesive from flowing away from the edges.

After the step of S203, another optional step S204 can also be performed. In step S204, the solar cell can be weighted to facilitate the flowing of the bonding adhesive.

Figure 4A:
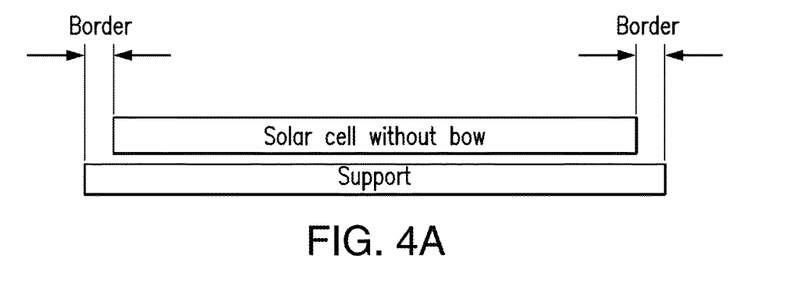
FIGS. 4A, 4B, and 4C schematically illustrate the configuration of the solar cell assembly obtained by certain embodiments of methods described herein.
Figure 4B:
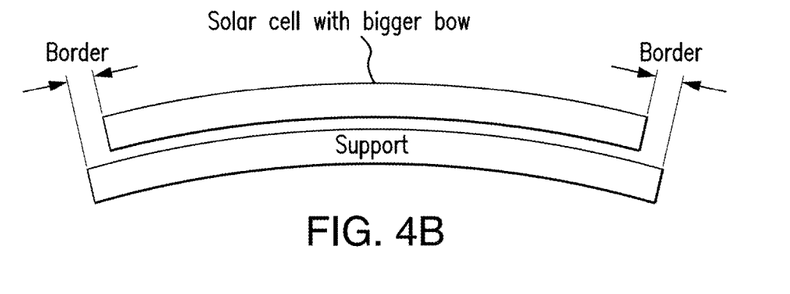
Figure 4C:
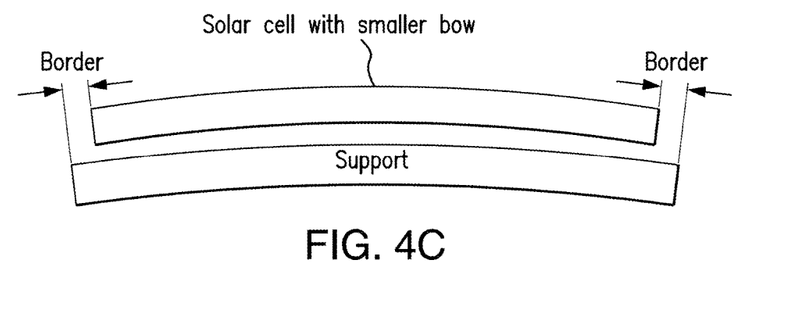

FIGS. 4A, 4B, and 4C schematically illustrate the configuration of the solar cell assembly obtained by the above described method. FIG. 4A illustrates a case that a solar cell is not bowing. FIG. 4B illustrates the case that a solar cell has a relatively bigger bow. FIG. 4C illustrates the case that a solar cell has a relatively smaller bow. Although the solar cell component is illustrated as one solar cell in FIGS. 4A, 4B, and 4C, it should be understood that the solar cell component can be in various forms. For example, the solar cell component can be a coverglass-interconnect-cell (CIC) assembly, a string of solar cells, or a string of coverglass-interconnect-cells (CICs), instead of one solar cell. Although not illustrated, each solar cell component may include multiple mechanical standoffs on its bottom side. For example, the multiple mechanical standoffs can be interconnects or shims.

In each of FIGS. 4A, 4B, and 4C, the bonding adhesive between the solar cell component and the support has a substantially uniform thickness. The flexible supports can conform to the bows of the solar cells, regardless of the degrees of bowing of the solar cells.

In all cases as illustrated by FIGS. 4A, 4B, and 4C, the flexible support can have substantially uniform borders extending beyond the solar cells of 0.003 inches to 0.2 inches in width. A part of the bonding adhesive can flow to the border of the support extending beyond the solar cell. This part of bonding adhesive can wick and stay adjacent the edges of the solar cell by surface tension, instead of flowing away from the edges.

Figure 5:
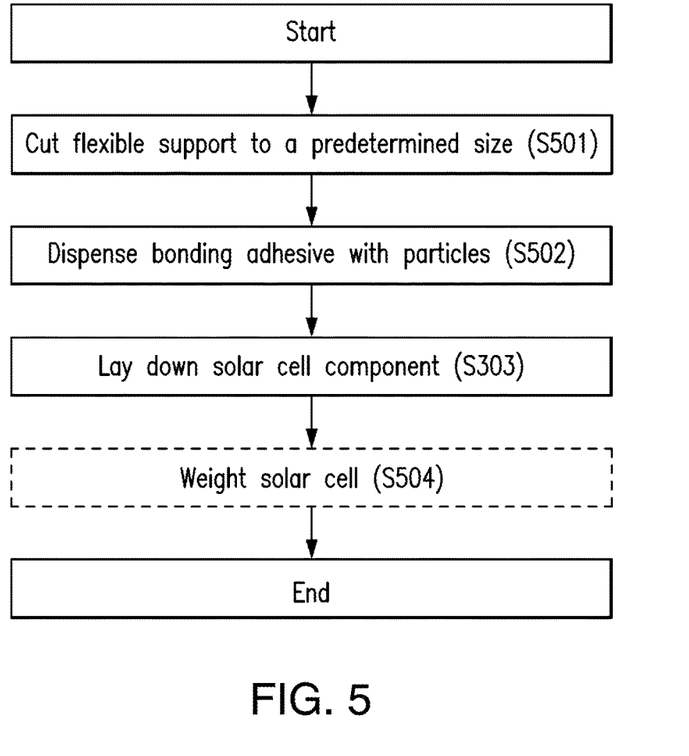
FIG. 5 schematically illustrates another embodiment of the method of bonding a solar cell component to a flexible support as described herein.

FIG. 5 schematically illustrates another embodiment of the method of bonding a solar cell component to a flexible support as described herein.

This embodiment illustrated in FIG. 5 is similar to that as illustrated in FIG. 2, except that the bonding adhesive includes rigid particles of substantially uniform size. In some embodiments, the rigid particles are spherical or substantially spherical. The rigid particles can be made of rigid material, such as glass. The material of the particles is not limited, as long as the particle is rigid.

Figure 6A:
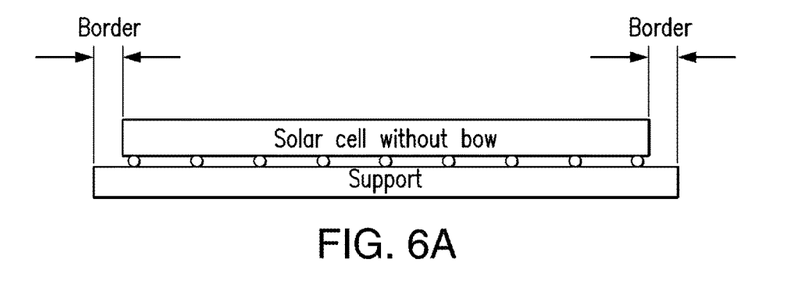
FIGS. 6A, 6B, and 6C are simplified views schematically illustrating the configurations of the solar cell assemblies obtained by the further embodiments.
Figure 6B:
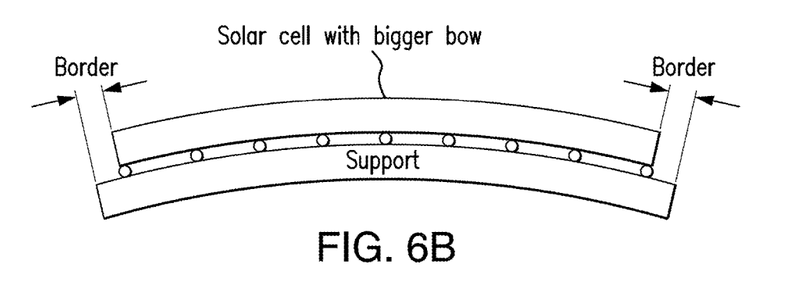
Figure 6C:
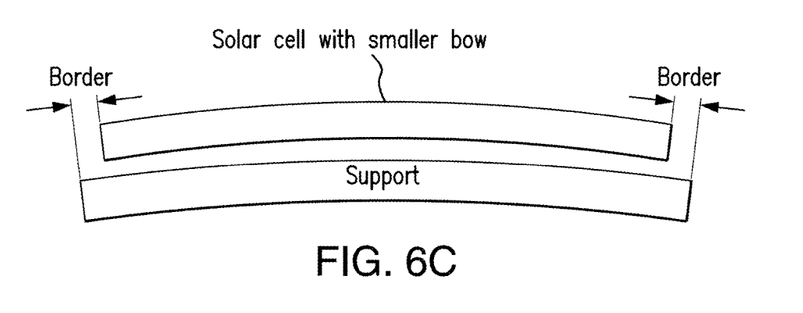

FIGS. 6A, 6B, and 6C are simplified views schematically illustrating the configurations of the solar cell assemblies obtained by further embodiments.

As illustrated by FIGS. 6A, 6B, and 6C, the rigid particles of substantially uniform size function to support the solar cells on the support. Accordingly, the substantially uniform size of the rigid particles further facilitates to ensure a substantially uniform thickness of the bonding adhesive, regardless of the degrees of bowing of the solar cells. As a result, the amount of bonding adhesive flowing to the border of the support is more amenable to control.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments described herein are, for example, capable of operation in other orientations than those illustrated or otherwise described herein.

Furthermore, those skilled in the art will recognize that boundaries between the above described operations merely illustrative. The multiple units/operations may be combined into a single unit/operation, a single unit/operation may be distributed in additional units/operations, and units/operations may be operated at least partially overlapping in time. Moreover, alternative embodiments may include multiple instances of a particular unit/operation, and the order of operations may be altered in various other embodiments.

In the claims, the word 'comprising' or 'having' does not exclude the presence of other elements or steps then those listed in a claim. The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The present invention can be embodied in various ways. The above described orders of the steps for the methods are only intended to be illustrative, and the steps of the methods of the present disclosure are not limited to the above specifically described orders unless otherwise specifically stated. Note that the embodiments of the present disclosure can be freely combined with each other without departing from the spirit and scope of the invention.

Although some specific embodiments of the present invention have been demonstrated in detail with examples, it should be understood by a person skilled in the art that the above examples are only intended to be illustrative but not to limit the scope of the present invention. It should be understood that the above embodiments can be modified without departing from the scope and spirit of the present invention which are to be defined by the attached claims.

The invention claimed is:

1. A method of bonding a solar cell component to a support, the method comprising:
   providing a solar cell component having a top side and a bottom side;
   providing a flexible support having a top side and a bottom side;
   cutting the support to a predetermined size;
   dispensing bonding adhesive on the top side of the support or on the bottom side of the solar cell component; and
   contacting the bottom side of the solar cell component with the top side of the support,
   wherein each border of the support independently extends beyond a corresponding edge of the solar cell component by a width of 0.003 inches to 0.2 inches.

2. The method of claim 1, wherein the bonding adhesive comprises rigid particles of substantially uniform size.

3. The method of claim 2, wherein the rigid particles are glass and spherical or substantially spherical.

4. The method of claim 1, wherein the bonding adhesive has a viscosity of 1000 mPas to 50000 mPas.

5. The method of claim 1, wherein contacting further comprises weighting the solar cell component in contact with the support.

6. The method of claim 1, wherein the solar cell component comprises multiple mechanical standoffs that are interconnects or shims on the bottom side of the solar cell component.

7. The method of claim 1, wherein the solar cell component is selected from the group consisting of a solar cell, a coverglass-interconnect-cell (CIC) assembly, a string of solar cells, a string of a coverglass-interconnect-cells (CICs), and combinations thereof.

8. The method of claim 1, wherein each border of the support independently extends beyond a corresponding edge of the solar cell component by a width of 0.003 inches to 0.1 inches.

9. The method of claim 1, wherein each border of the support independently extends beyond a corresponding edge of the solar cell component by a width of 0.003 inches to 0.05 inches.

10. The method of claim 1, wherein each border of the support independently extends beyond a corresponding edge of the solar cell component by a width of 0.005 inches to 0.025 inches.

11. The method of claim 1, wherein each border of the support independently extends beyond a corresponding edge of the solar cell component by a width of 0.010 inches to 0.025 inches.

12. The method of claim 1 wherein each border of the support extends beyond a corresponding edge of the solar cell component by a substantially uniform width of 0.003 inches to 0.2 inches.

13. A method of bonding a solar cell component to a support, the method comprising:
   providing a non-flat, bowed solar cell component having a top side and a bottom side;
   providing a flexible support having a top side and a bottom side;
   cutting the support to a predetermined size;
   dispensing bonding adhesive on the top side of the support or on the bottom side of the solar cell component; and
   contacting the bottom side of the solar cell component with the top side of the support,
   wherein each border of the support independently extends beyond a corresponding edge of the solar cell component by a width of 0.003 inches to 0.2 inches.

14. The method of claim 13, wherein the bonding adhesive comprises rigid particles of substantially uniform size.

15. The method of claim 14, wherein the rigid particles are glass and spherical or substantially spherical.

16. The method of claim 13, wherein the bonding adhesive has a viscosity of 1000 mPas to 50000 mPas.

17. The method of claim 13, wherein contacting further comprises weighting the solar cell component in contact with the support.

18. The method of claim 13, wherein the solar cell component is selected from the group consisting of a solar cell, a coverglass-interconnect-cell (CIC) assembly, a string of solar cells, a string of a coverglass-interconnect-cells (CICs), and combinations thereof.

19. The method of claim 13 wherein each border of the support extends beyond a corresponding edge of the solar cell component by a substantially uniform width of 0.003 inches to 0.2 inches.

20. A method of bonding a solar cell component to a support, the method comprising:

providing a non-flat, bowed solar cell component having a top side and a bottom side, wherein the solar cell component comprises multiple mechanical standoffs that are interconnects or shims on the bottom side of the solar cell component, wherein the solar cell component is selected from the group consisting of a solar cell, a coverglass-interconnect-cell (CIC) assembly, a string of solar cells, a string of a coverglass-interconnect-cells (CICs), and combinations thereof;

providing a flexible support having a top side and a bottom side;

cutting the support to a predetermined size;

dispensing bonding adhesive having a viscosity of 1000 mPas to 50000 mPas on the top side of the support or on the bottom side of the solar cell component, wherein the bonding adhesive comprises rigid glass particles of substantially uniform size that are spherical or substantially spherical;

contacting the bottom side of the solar cell component with the top side of the support; and weighting the solar cell component in contact with the support, wherein each border of the support extends beyond a corresponding edge of the solar cell component by a substantially uniform width of 0.010 inches to 0.025 inches.

\* \* \* \* \*